(12) United States Patent
Knowles et al.

(10) Patent No.: US 9,716,463 B2
(45) Date of Patent: Jul. 25, 2017

(54) PIEZOELECTRIC ENERGY HARVESTER

(71) Applicant: Qortek, Inc., Willaimsport, PA (US)

(72) Inventors: Gareth J. Knowles, Williamsport, PA (US); William M. Bradley, Williamsport, PA (US)

(*) Notice: Subject to any disclaimer, the term of this patent is extended or adjusted under 35 U.S.C. 154(b) by 344 days.

(21) Appl. No.: 14/346,839

(22) PCT Filed: Sep. 24, 2012

(86) PCT No.: PCT/IB2012/002360
§ 371 (c)(1),
(2) Date: Mar. 24, 2014

(87) PCT Pub. No.: WO2013/041968
PCT Pub. Date: Mar. 28, 2013

(65) Prior Publication Data
US 2015/0256118 A1    Sep. 10, 2015

Related U.S. Application Data

(60) Provisional application No. 61/538,524, filed on Sep. 23, 2011.

(51) Int. Cl.
| | | |
|---|---|---|
| H01L 41/047 | (2006.01) | |
| H02S 10/10 | (2014.01) | |
| H01L 31/042 | (2014.01) | |
| H01L 41/113 | (2006.01) | |
| H02N 2/18 | (2006.01) | |

(52) U.S. Cl.
CPC ........... *H02S 10/10* (2014.12); *H01L 31/042* (2013.01); *H01L 41/0471* (2013.01); *H01L 41/1134* (2013.01); *H01L 41/1136* (2013.01); *H02N 2/181* (2013.01); *H02N 2/186* (2013.01); *Y02E 10/50* (2013.01)

(58) Field of Classification Search
CPC ...... H02S 10/10; H02N 2/181; H01L 41/0471
USPC ................. 310/339, 371, 311, 370; 29/592.1
See application file for complete search history.

(56) References Cited

U.S. PATENT DOCUMENTS

| 8,198,789 | B2 | 6/2012 | Choi |
|---|---|---|---|
| 8,901,802 | B1 | 12/2014 | Que |
| 2009/0295257 | A1 | 12/2009 | Wang et al. |

(Continued)

FOREIGN PATENT DOCUMENTS

| KR | 10-2011-0011381 A | 2/2011 |
|---|---|---|
| KR | 10-2011-0021637 A | 3/2011 |

(Continued)

OTHER PUBLICATIONS

International Application No. PCT/IB2012/002360, International Preliminary Report on Patentability, dated Mar. 25, 2014.

*Primary Examiner* — Thomas Dougherty
*Assistant Examiner* — Karen B Addison
(74) *Attorney, Agent, or Firm* — Cahn & Samuels, LLP

(57) ABSTRACT

The invention is directed to a piezovoltaic energy harvesting laminate that includes a photovoltaic laminar wafer comprised of a plurality of photovoltaic cells and a dielectric wafer that converts mechanical energy to electrical energy. A boundary laminate interface is disposed between the photovoltaic laminar wafer and the dielectric wafer. The boundary laminate contains a metallization layer electrical terminal for the photovoltaic cells and a conduction layer of the dielectric wafer.

13 Claims, 10 Drawing Sheets

(56) References Cited

U.S. PATENT DOCUMENTS

| | | | |
|---|---|---|---|
| 2010/0136245 A1 | 6/2010 | Albano et al. | |
| 2012/0086310 A1* | 4/2012 | Allaei | H02N 2/185 310/339 |
| 2013/0181578 A1* | 7/2013 | Kameda | B60C 23/0411 310/339 |
| 2013/0257156 A1* | 10/2013 | Hadimani | H01L 27/301 310/339 |

FOREIGN PATENT DOCUMENTS

| | | | | |
|---|---|---|---|---|
| KR | 20-2011-0003667 U | | 4/2011 | |
| KR | 020110001895 | * | 4/2011 | H01L 41/083 |

* cited by examiner

PIEZOELECTRIC ENERGY HARVESTER

This application claims the benefit of U.S. Provisional Application Ser. No. 61/538,524, filed Sep. 23, 2011 which is hereby incorporated by reference.

This invention was made with government support under Contract No. N00039-11-C-0015 awarded by the United States Navy. The government has certain rights in the invention.

I. FIELD OF THE INVENTION

The invention relates to devices capable of passive energy harvesting from multiple sources.

II. BACKGROUND TO THE INVENTION

There has been extensive independent development of vibration-based and photovoltaic-based passive energy harvesting; however, both approaches have their major limitations due to limited environmental condition operational windows that are appropriate for energy conversion to function.

Certain ferroelectric materials (e.g., quartz and Rochelle salts, and bulk ceramic materials) are known to produce a voltage between surfaces of a solid dielectric when a mechanical stress is applied. This phenomenon is known as the piezoelectric effect and may be used to convert mechanical energy, such as vibration, to electrical current. Such materials are now found in both stiff ceramic, soft polymeric and semi-flexible multi-laminates such as described in U.S. Pat. No. 6,665,917 entitled "METHOD OF FABRICATING A PLANAR PRE-STRESSED BIMORPH ACTUATOR" and issued to Knowles et al.

When subject to vibratory conditions such materials will yield electrical energy; however, in practice this is often not the situation. There may be periods for which little or no vibration is present, such as in storage or idle mode. An example is vehicular mounted vibration conversion devices. These can convert while the vehicle is in transit, but they do not generate electrical energy when the vehicle is stationary or moving slowly.

Harvesting solar or light energy is known. In theory, devices having solar cells never need batteries and can work forever. Photovoltaic cells or modules (a grouping of electrically connected cells) can be provided in a device to convert sunlight into energy for powering a device. An example of a self-powered solar system includes U.S. Pat. No. 6,914,411 entitled "POWER SUPPLY AND METHOD FOR CONTROLLING IT" and issued to Couch et al. Couch et al. discloses a self-powered apparatus including a solar power cell, a battery, and a load. The load may include one or more load functions performed using power provided by one or both of the solar power cell and the battery. Switching circuitry, controlled by the programmable controller, selectively couples one or both of the battery and the solar cell to supply energy for powering the load. In a preferred embodiment taught by Couch et al, the controller couples the battery and/or solar cell to charge a super capacitor.

However, photovoltaic-based passive energy harvesting devices are non-functional for significant periods of time over which the systems they are integrated into, or attached to, are not exposed to sunlight, resulting to this type of self-power as being unreliable. An example is roadway mounted photovoltaic panels. These are typically pole-mounted on the roadside as to power either traffic monitoring or remote communication capabilities. At night or during inclement weather such energy conversion mechanisms are non-effective in conversion of energy to electrical form. Another example is self-powered remote communications that come equipped with a solar panel to generate energy as to extend battery lifetime. These can convert sunlight into electrical energy using the solar photovoltaic energy harvesting effect, but there will be long periods over which such sunlight is absent.

However, it is interesting to observe that these same roadway solar panels can be subject to vibratory excitation during these non-functional solar periods due to a number of sources such as wind, passing traffic or heavy rain. Again, it is interesting to observe that remote deployed communications can be subject to vibratory excitation during these non-functional solar periods due to a number of sources such as wave motion, physical transportation or in situ motion—such as soldier movements.

Although it is feasible to install both photovoltaic energy conversion devices and vibratory conversion devices as to substantially broaden the overall window of energy harvest conditions, it is usually unrealistic for several reasons: increased complexity of having two separate systems incurring two sets of installation time, cost, and volume penalties; and two sets of electronics; form/fit/function limitations that can prevent multiple energy harvest systems within a single platform or application; system connector limitations and accumulation of system loss.

What is needed is a solution to enabling a single integrated device that is approximately the same physical size, manufacture cost and install complexity of a standard photovoltaic energy harvester, such as a solar panel or array, but that can simultaneously act as to efficiently convert mechanical energy even when there is no sunlight as to provide a more continuous source, or an enhanced source when sunlight is available, of passive environment energy conversion to electrical energy.

III. SUMMARY OF THE INVENTION

In at least one embodiment, the invention comprises a thin laminate construction of doped silicon, polymer, dielectric and metallic layers that enables the ability to convert environmental energy to electrical energy over a wide range of environmental conditions. The device is nearly the same size, form factor and manufacture cost and install complexity as a standard photovoltaic energy harvesting mechanisms i.e. solar panels. The invention provides for both lightweight and low profile devices that can simultaneously or separately convert both sunlight and mechanical energy to electrical energy with improved efficiencies. It can be constructed in a flat or curvilinear geometry that can be either rigid or flexible.

The design is amenable to both discrete manufacture and reel-to-reel bulk manufacture of solar panels as to enable a wide range of manufacture process solutions. The design benefits directly from the process manufacture steps that are undertaken in solar panel manufacture; in particular, it exploits the fact that solar panels have a metallic layer acting as the substrate to the doped junction material that now one of the electrode layers for the device. This might typically consist of taking an N-semiconductor that may be doped as usual with the silicon layer, however, prior to metallization being applied with N-doped silicon in accordance with known methods for making ohmic contacts that is combined with piezoelectric material. The invention can exploit the fact that the cathode metallization of the silicon junction diode cells in a solar panel wafer can act as the metallization layer in a dielectric energy harvest mechanism, it can also exploit that a polymer coating is already used in solar panel production as to protect the solar cells.

The invention synergistically integrates photovoltaic electrical energy generation devices (solar cells or panels) and ferroelectric vibration conversion electrical energy generation devices such as piezoceramics or piezopolymers in a laminated structure as to retain the same footprint and nearly the same thickness of the original photovoltaic electrical energy conversion mechanism. The use of the photovoltaic polymer coating of the protection coating is now extended as to include the ferroelectric layer(s) within the invention.

Directly integrated laminate devices that consist of a Piezovoltaic layer whose metallic side simultaneously acts as to be the electrode layer of a ferroelectric energy conversion lamination is here termed Piezovoltaic (PZV) device. The PZV device can incorporate a single layer of ferroelectric mechanical to electrical conversion material, or a multiple such set of layers. These can be implemented in a stiff format using piezoceramic materials or a flexible format using piezopolymer materials and thin piezoceramic beams or can be manufactured in fully flexible format by employing piezopolymer as the conduction layers or by employing flexoelectric materials. Further advances can be obtained by employing Metamaterials in the construction.

A further flexible PZV construction can consist of a flexible photovoltaic layer that is integrated in the manner of this invention with the semi-flexible bimorph of U.S. Pat. No. 6,665,917 as to create a laminated structure with significant flexibility and enhanced capability of mechanical to electrical energy conversion.

There are several ways to construct the basic PZV devices as to include sputtering or deposition of the ferroelectric material as an underlay to the metallic base of the photovoltaic laminate construction either prior or during its manufacture process.

A second methodology for discrete assembly of PZV devices of the invention is where the assembly comprises of certain layers bonded in a laminate construction. In this discrete implementation a pre-manufactured vibration conversion laminate beam or plate is directly bonded to the metalized (non-solar exposed) side of a pre-manufactured photovoltaic layer—normally of the same approximate size.

Individual PZV devices and arrays of such devices can further be enhanced by arrangement in a cantilever panel that mimics a standard photovoltaic array panel. The cantilever arrangement allows for a bending motion of the individual PZV elements as to induce stress at their fixture end, which, in turn, will induce a high rate of mechanical to electrical energy conversion. Integrating mass distribution as to match the typical vibration spectra of the application can further enhance such an arrangement.

In normal operation the Piezovoltaic layer is installed as to face a possible sunlight direction. The reverse, or bottom, layer(s) that comprise the mechanical energy conversion layer can be positioned away from sunlight as this does not affect its performance. When subject to mechanical induced vibration, as with a roadside mounted solar panel, the bottom layer will generate electrical energy.

It is an advantage of construction that a PZV beam or plate only marginally increases overall thickness of its underlying solar energy conversion unit while adding nothing to the overall planar area of the underlying solar energy conversion unit.

It is an advantage of PZV design that the two forms of energy conversion can now commonly share much of the required energy conversion electronics that take the environmental energy form—photonic, shock, vibration and thermal; and converts this into electrical energy (charge). This further significantly reduces overall size, manufacture costs, and installation complexity.

It is an advantage that, in at least one embodiment, the invention may provide intermittent microwatt levels of power generation superimposed on continuous milliwatt levels of power generation as to enable high collection efficiency in a compact volume over a wide operational window that can include mechanical excitation states, sunlight exposure states or both.

It is an advantage that mechanical shock and vibration, such as during transport, wear or operational use can produce short-term energy conversion levels greater than the more steady-state PV energy conversion levels. When the equipment is subjected to little or no mechanical excitation, any sunlight exposure will still be capable of replenishing the batteries.

It is an advantage that PZV devices, or integrated modular arrays using piezoelectric beams in a cantilever construction, can reduce the overall cost of separate devices—more importantly the devices can be integrated as to drastically reduce the overall volume/weight compared to separate installation.

It is an advantage that PZV devices can reduce the cost of incorporating separate devices—more importantly the devices can be integrated as to drastically reduce the overall volume/weight compared to separate installation.

It is an advantage that PZV devices can operate in all-weather conditions and be converting environmental energy to electrical energy in all such conditions.

Because it can be manufactured from low cost parts in a low profile and highly durable package, such modules provide an ideal solution for applications such as remote observation and communication systems. Such applications can include attended and unattended power harvesting for military and commercially deployed equipment; integration into loitering platforms as to extend mission duration; roadside energy harvesting as replacement for modular solar panels (usually remote comm. for traffic flow monitoring equipment) and hybrid/electric automotive integration.

IV. BRIEF DESCRIPTION OF THE DRAWINGS

Figure 3:
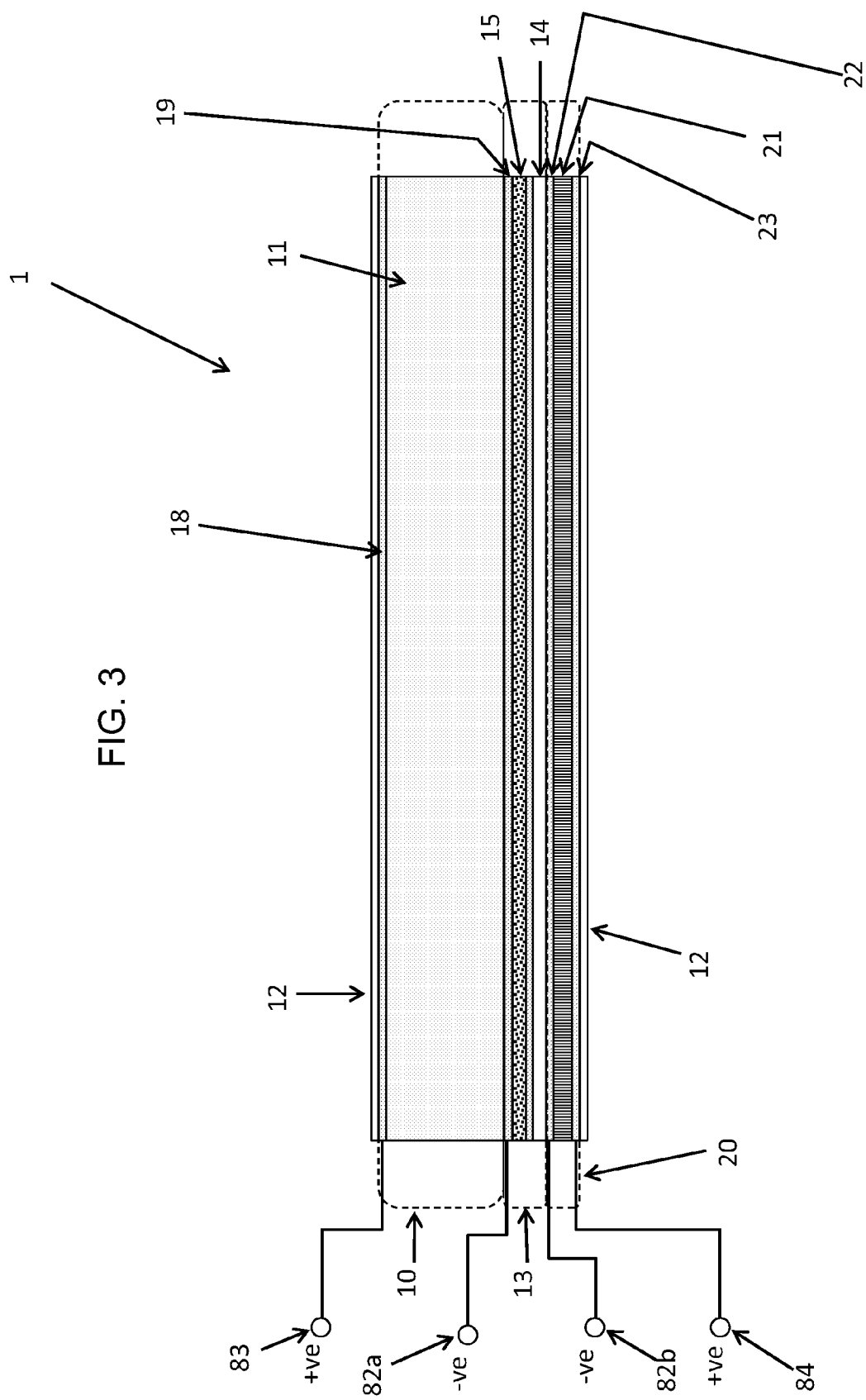
FIG. 3 is a diagram of an isolation boundary Piezovoltaic mechanism of the design of FIG. 1.
Figure 6:
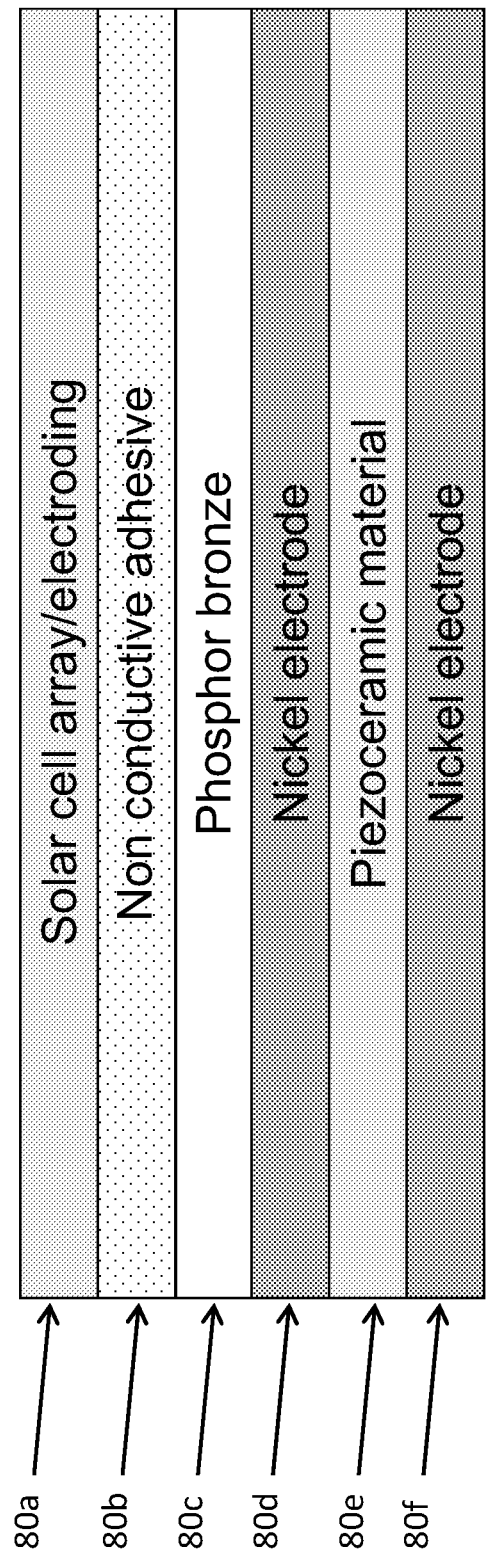

FIG. 6 provides a preferred embodiment of the design of FIG. 3.

Figure 7:
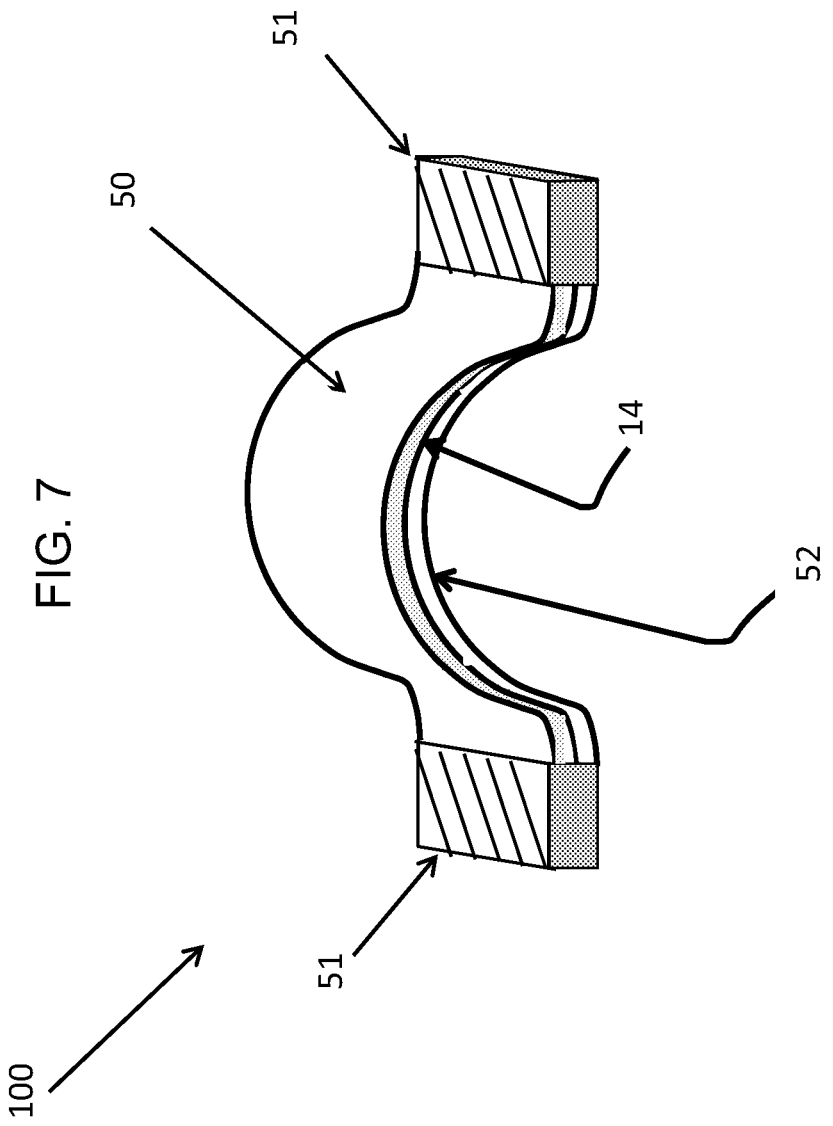

FIG. 7 depicts a curvilinear laminate Piezovoltaic construction.

Figure 8:
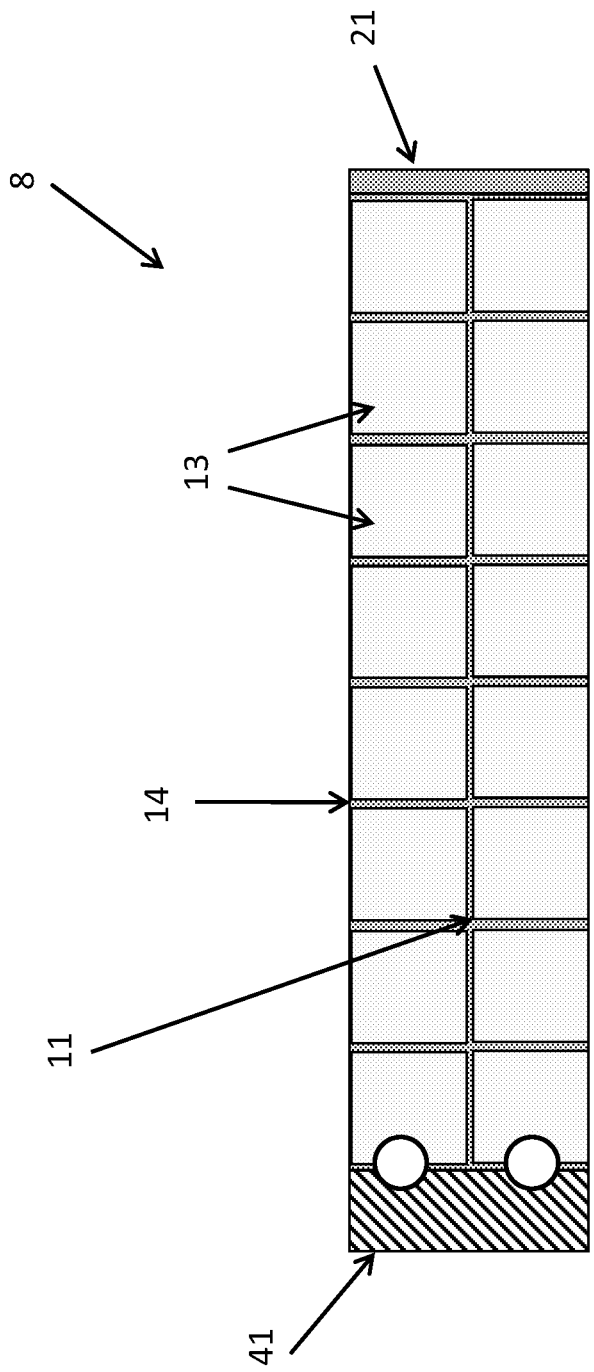

FIG. 8 depicts a cantilever laminate Piezovoltaic construction.

Figure 9:
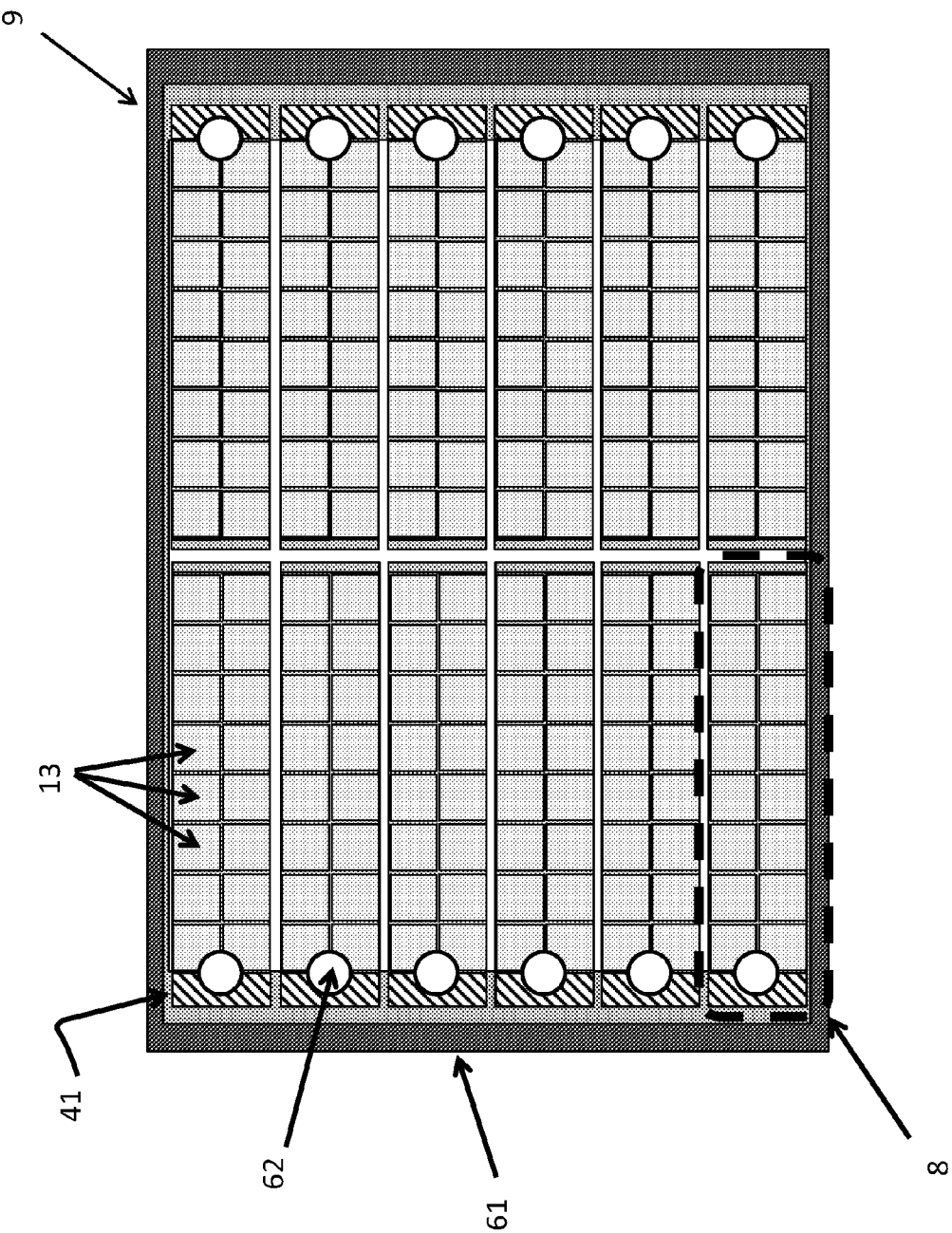

FIG. 9 depicts the top-view of a deployable Piezovoltaic panel.

Figure 10:
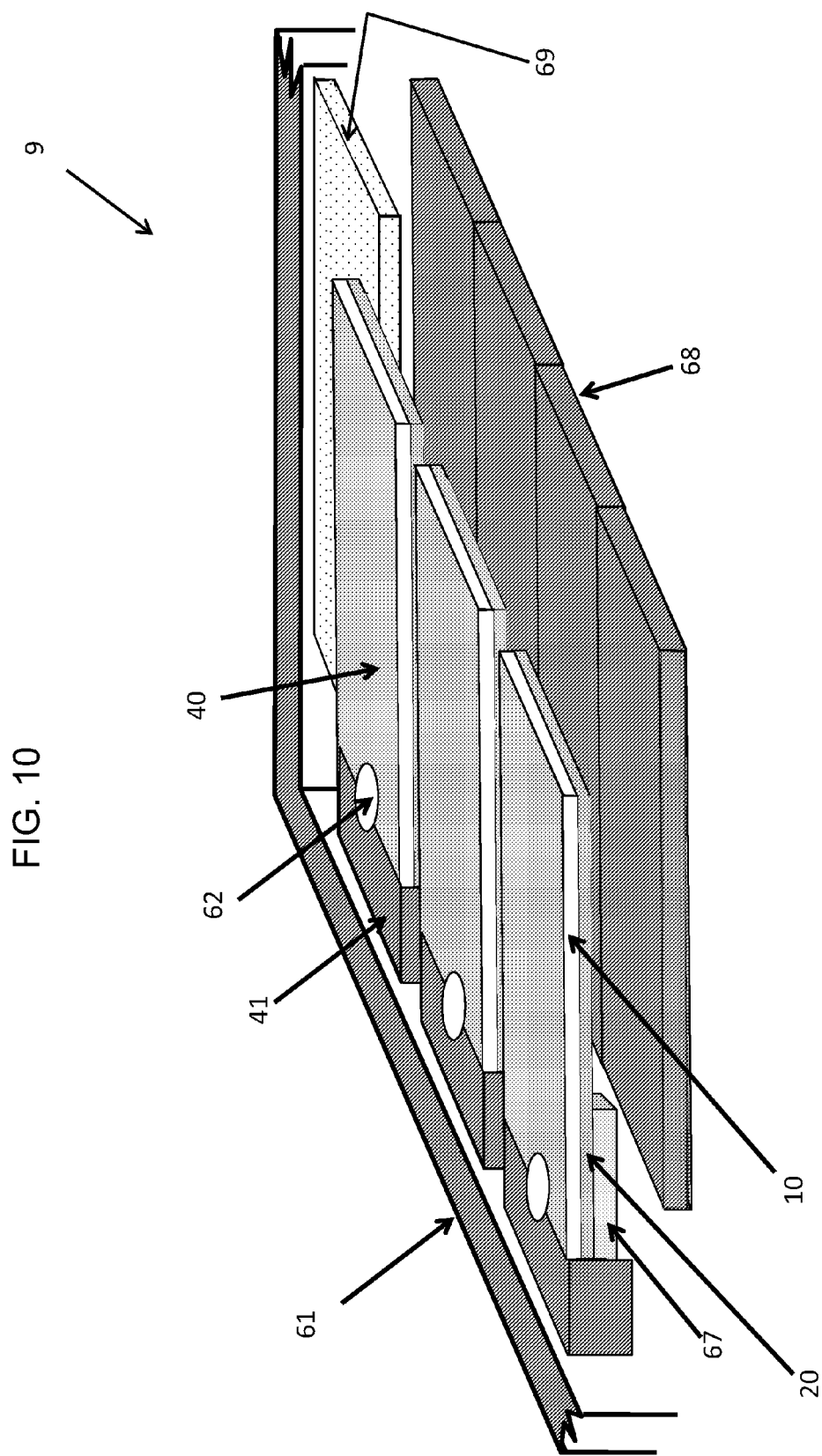

FIG. 10 depicts the side-view of a deployable Piezovoltaic panel.

V. DESCRIPTION OF THE EMBODIMENTS OF THE INVENTION

Figure 1:
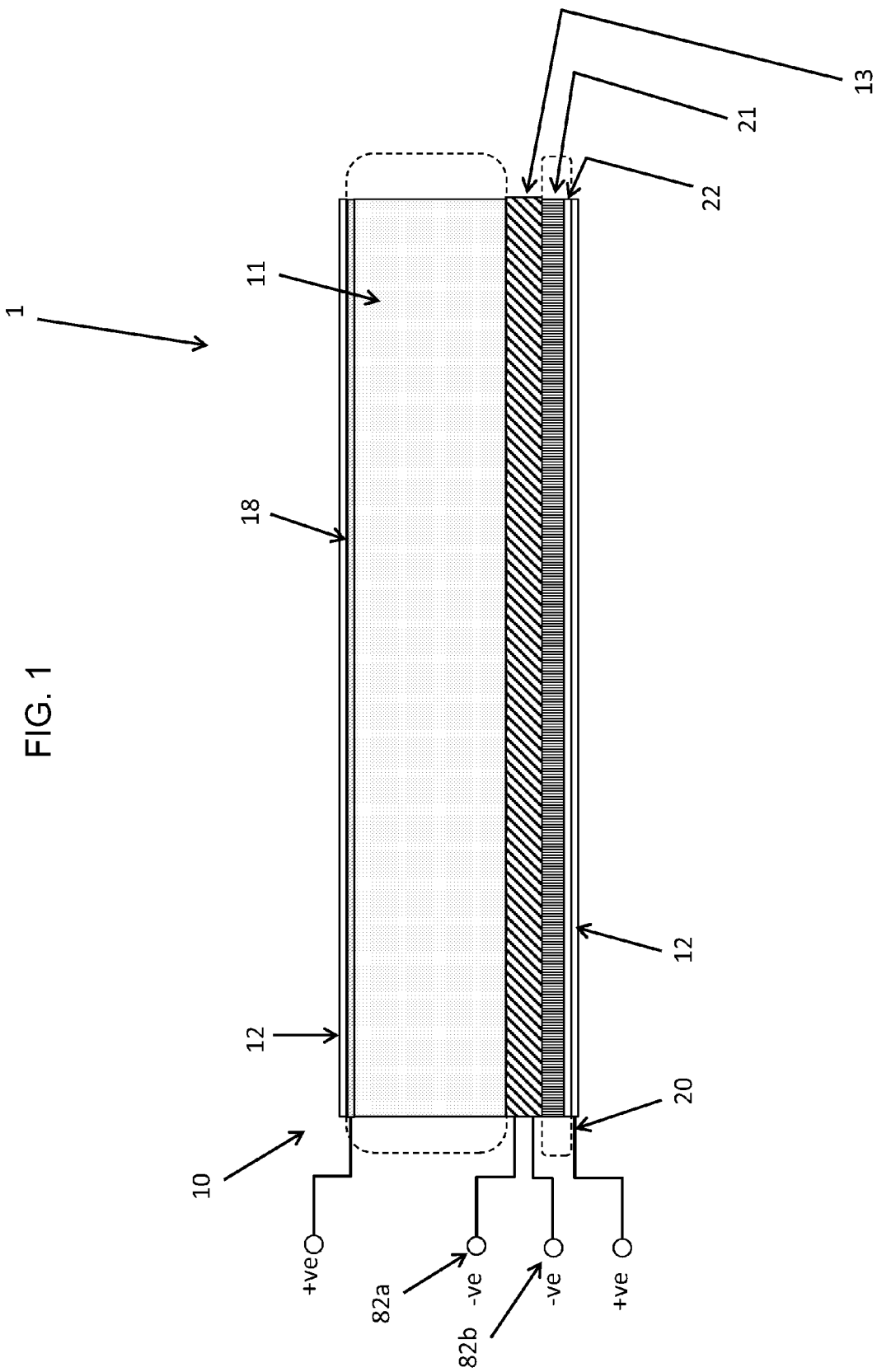
FIG. 1 is a diagram of a composited laminate Piezovoltaic mechanism.

FIG. 1 provides a composited lamination of photovoltaic junction cells, dielectric materials an polymers obtained through manufacture process steps are not to scale, so that there is no proportional enlargement of the individual elements. The same elements of the individual cross-sectional segments, however, have the same reference numbers. The process as disclosed by the invention uses a lamination of individual solar cells 18 that can be represented either by a silicon wafer 11 alone. The photovoltaic energy harvesting device 10 consists of the silicon wafer 11 adjacent to a boundary layer 13 that acts as the an electrical termination electrode of the individual wafer 11 and a protection layer 12. The piezovoltaic composited laminate is a 4-termal device whose outputs are a DC voltage potential between 18 and 82a and an AC voltage potential between 22 and 82b.

It is common in prior art to develop some form of piezoceramic unimorph or bimorph 20 to act as an energy conversion device. A charge in this material 20 appears as a variation of surface charge density on its top and bottom surfaces that causes an electrical potential to be formed between the top surface and bottom surface. Such common devices are typically installed in some version of a cantilever or other supported systems whereby the mechanical excitation acting on the device induces stress that is converted to electrical energy conversion via the 'so-called' piezoelectric 'direct effect'. The electrical field caused between the plates 13 and 22 are determined by the "g" constant of the selected material, such that open circuit electric field is equal to g multiplied by applied mechanical stress. For cantilever devices the stress loading increases towards the root and therefore the maximal charge induced is similarly maximal towards the root. Thus, as a dielectric capacitor the mechanism 21 has a conductive, normally metallic material, layers adhered to its top and bottom sides. In FIG. 1 is shown where the boundary lamination wherein 13 additionally provides the positive terminal of the mechanical energy conversion capable dielectric capacitor 20.

In standard manufacture process a polymer, usually urethane is used as a coating 12 to protect the individual junction cells. This protection polymer 12 can now simultaneously be applied in the same process step to the underside of the attached Piezovoltaic device 1 as to protect the entire device from environmental damage.

It will be obvious that a similar construction may incorporate a multilayer laminate vibration energy harvesting device such as of a multi-laminate geometry composite construction or manufactured from other materials such as a Metglas laminated cantilever beam or plate.

Figure 2:
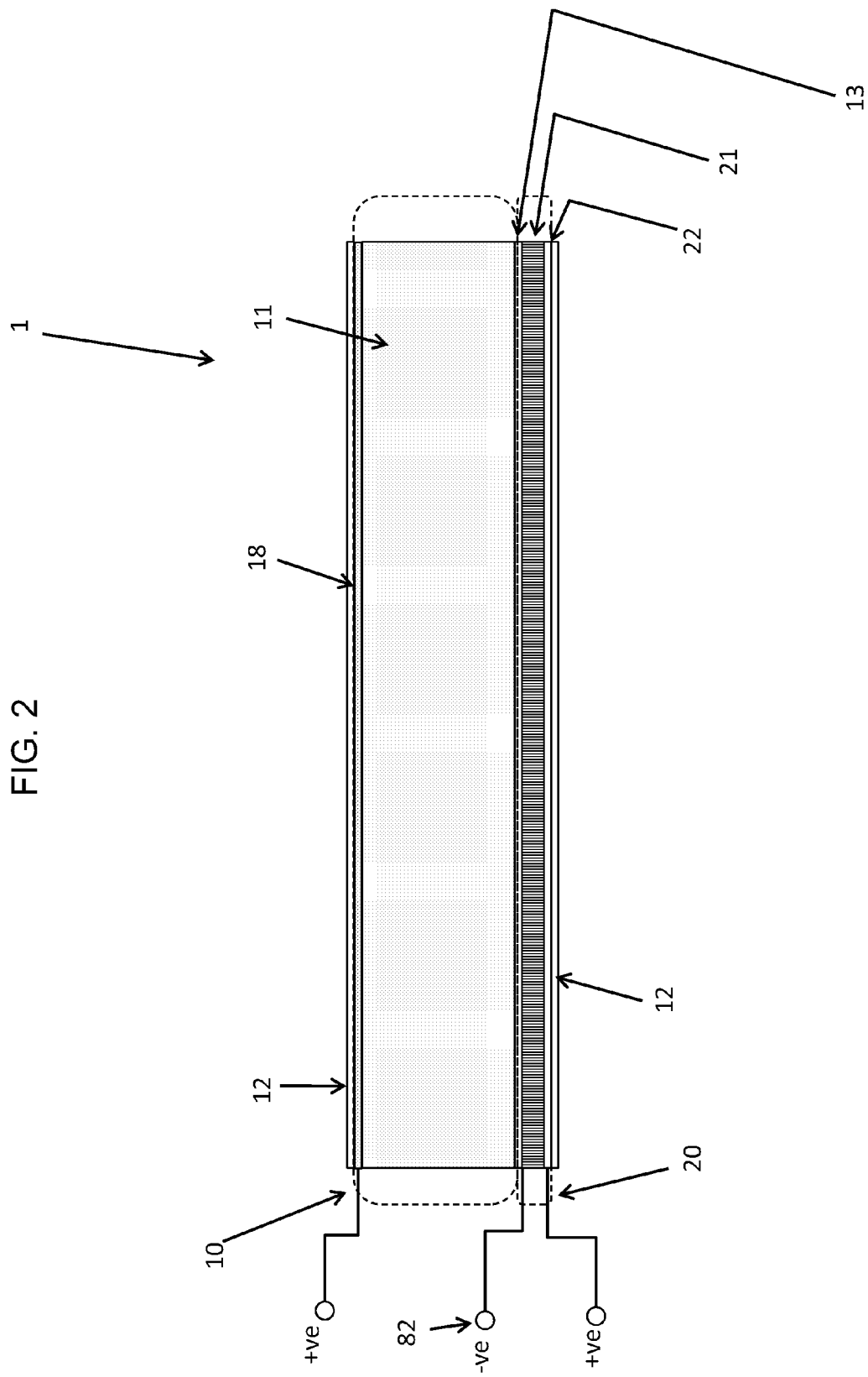
FIG. 2 is a diagram of a preferred embodiment of a 3-terminal Piezovoltaic mechanism of the design of FIG. 1.

FIG. 2 is a 3-terminal embodiment of FIG. 1 is where the boundary layer 13 consists of a single metallization layer of the wafer. The output electrical terminal 82 is simultaneously the output electrical terminal 82a of the wafer 11 and the output electrical terminal 82 of the metalized termination (plate) of the dielectric material 21. That is 82=82a=82b.

The cross sectional segments of the composite laminate of FIG. 3 of the invention obtained through manufacture process steps are not to scale, so that there is no proportional enlargement of the individual elements. The same elements of the individual cross-sectional segments, however, have the same reference numbers. The process as disclosed by the invention uses an array of individual solar cells that can be represented either by a silicon wafer 11 alone. FIG. 3 describes a 4-terminal integrated discrete Piezovoltaic energy harvesting mechanism. The laminated structure consists of a set of junction cells forming a photovoltaic wafer 11 with its common junction positive metallization 18 and its negative metallization 19. A mechanical energy conversion laminate 20 that provides mechanical to electrical conversion as to yield a potential difference between its conduction layers 22 and 23 when subject to stress loading is conjoined to 20 using an adhesive conduction layer 15. A high stiffness isolation layer 14 is interposed between (+ve) terminal layer 22 and an adhesive conduction layer 15. Isolation layer 14 may be electrically conductive and sufficiently stiff to push the neutral axis out of the dielectric material. That is, when the dielectric material is bent, the material is either in net compression (bent downward) or net tension (bent upward). Accordingly, in some embodiments, the isolation layer 14 has a Young's Modulus of at least that of the dielectric layer 21. For example, isolation layer 14's Young's Modulus may be between 40 GPa and 400 GPa in some embodiments, between 80 GPa and 110 GPa in some embodiments and between 110-130 GPa in some embodiments. The high stiffness layer 14 causes a shift of the neutral axis of 20 as to cause increase in the stress coupling of the dielectric material 21. This increase in stress will result in a corresponding increase in AC voltage potential difference as seen between conductive terminals 82b and 84 in response to stress loading on 1. A DC voltage potential will exist between conductive terminals 82a and 83 in response to exposure to sunlight.

In standard manufacture process a polymer, usually urethane is used as a coating 12 to protect the individual junction cells. This protection polymer 12 can now simultaneously be applied in the same process step to the underside of the attached Piezovoltaic device 1 as to protect the entire device from environmental damage.

It will be obvious that a similar construction may incorporate a multilayer laminate vibration energy harvesting device such as of a multi-laminate geometry composite construction or manufactured from other materials such as a Metglas laminated cantilever beam or plate.

Figure 4:
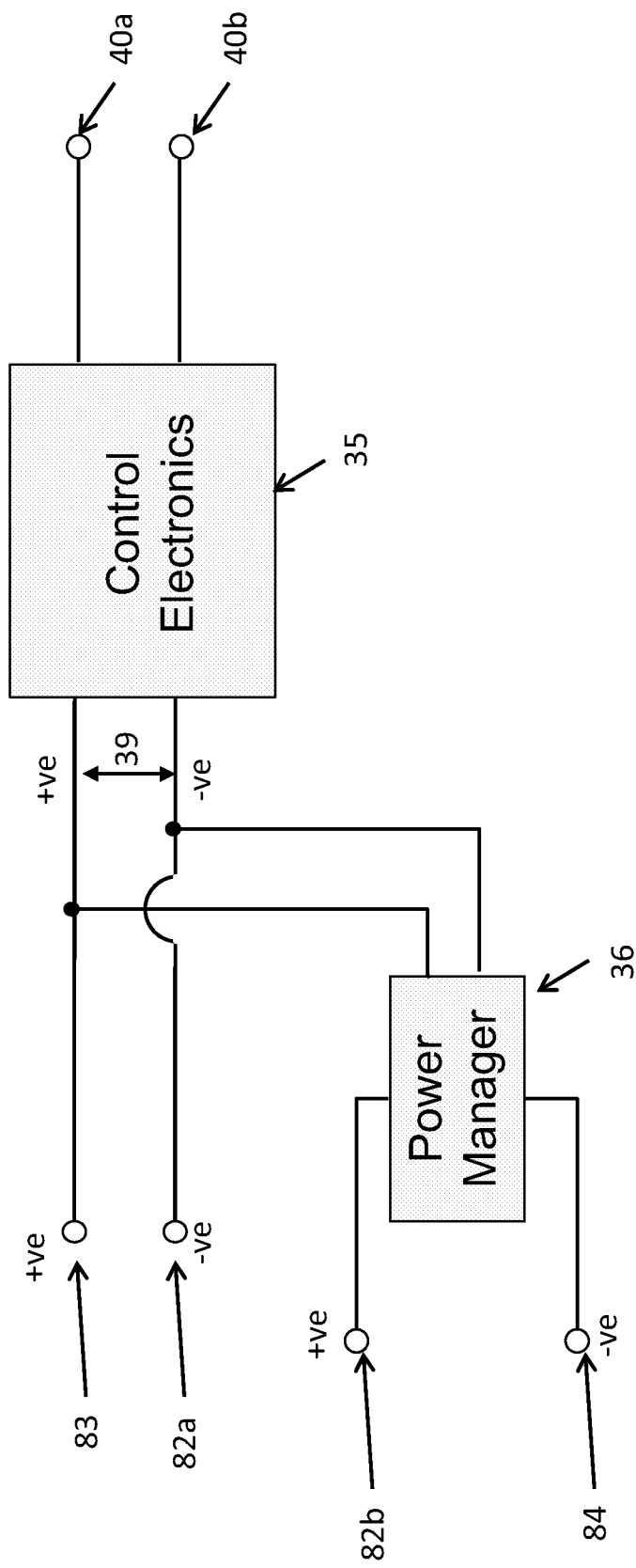
FIG. 4 depicts the shared control electronics power management electrical circuit of multi-purpose energy harvesting.

FIG. 4 provides the electrical connections of a 4-terminal integrated photovoltaic and mechanical energy conversion available to a Piezovoltaic device. The voltage potential between terminals 82a and 83 of the solar energy laminates of the device 1 in response to exposure to sunlight is a DC voltage. The ac voltage potential between 82b and 83 is connected to a power management circuit 36 whose output is a DC voltage. The two DC voltages are additive inputs into single set of control electronics 35 as to provide power to its output side electrical load, such as a battery, from both sources.

An embodiment of FIG. 4 is obtained where the management circuit 36 consists of a rectification stage.

Figure 5:
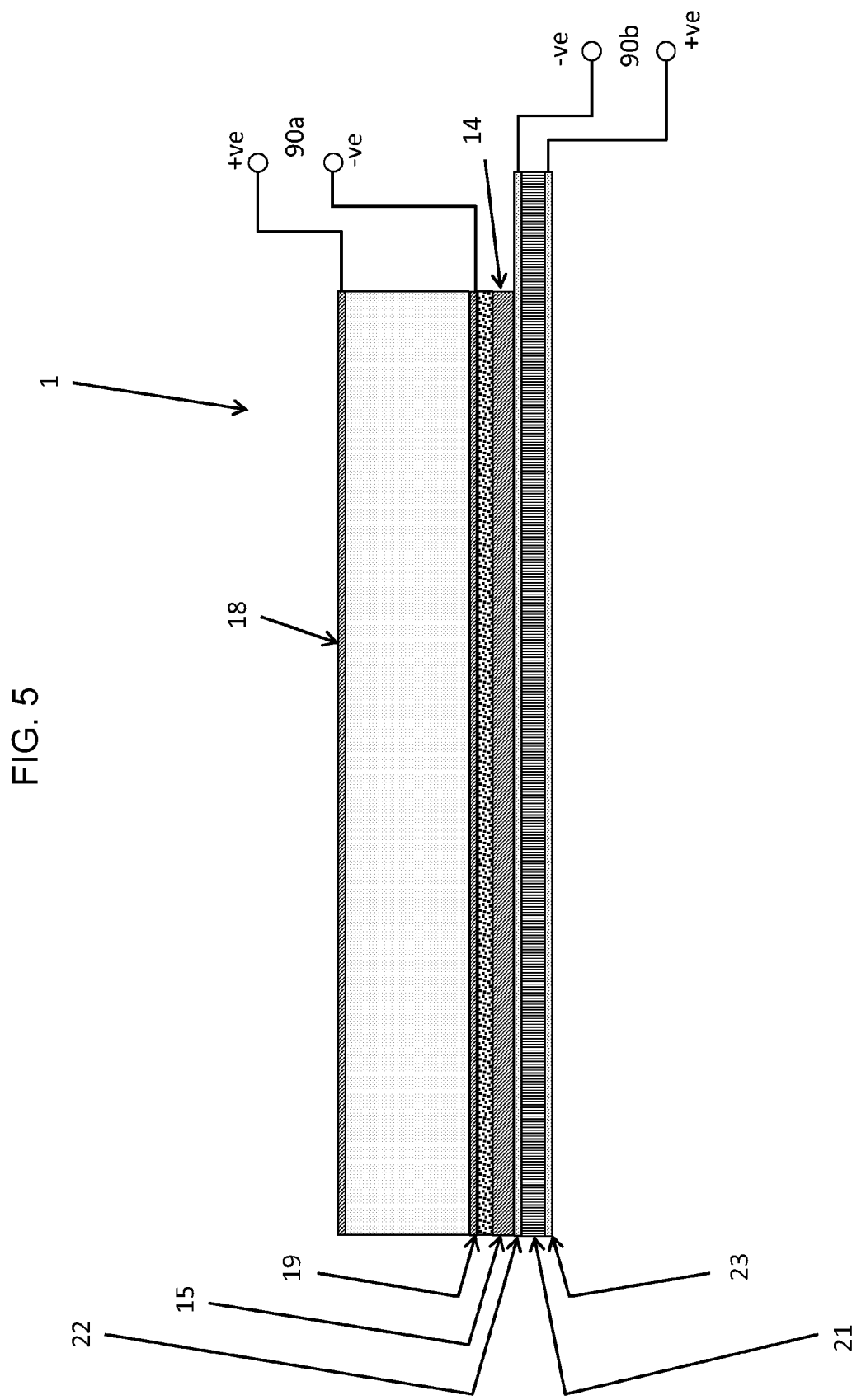
FIG. 5 depicts the physical electrical termination arrangement as to enable shared control electronics power management of multi-purpose energy harvesting.

FIG. 5 provides a representation of the physical connections of the conductive terminals for an integrated discrete Piezovoltaic energy harvesting mechanism The dielectric and its electroding 20 are extended as to form a base for the photovoltaic layers 10 and boundary interface layers 13 as to also enable terminal connections access 82b and 84 of FIG. 3 to metalized layers of the mechanical energy converter. A second set of terminations 82a and 83 of FIG. 3 are located at the common positive terminal of the cell diode junctions 18 and the common wafer metallization layer 19 within or comprising the boundary layer 13. The non-conductive adhesive 15 should be selected for stiffness properties and electrical isolation properties as to ensure that it provides an adequate isolation between both sets of terminals 90a and 90b.

FIG. 6 provides a block representation of one preferred embodiment of an integrated discrete Piezovoltaic energy harvesting mechanism. The cross sectional segments of FIG. 6 of the invention obtained through manufacture process steps are not to scale, so that there is no proportional enlargement of the individual elements. The same elements of the individual cross-sectional segments, however, have the same reference numbers. In this construction the vibration energy harvester consists of a symmetric piezoelectric bimorph consisting of piezoceramic material 80e whose top and bottom layers, 80d and 80e respectively, have been duly electroded and poled in the d31 direction. The device is asymmetrically increased in effective stiffness through the action of adhering a high stiffness phosphor bronze layer 80c to the (+ve) electroding layer 80d. A silicon photovoltaic wafer is subsequently bonded to the opposite side of phosphor bronze layer 80c using a non-conductive adhesive agent.

FIG. 7 provides a representation of non-cantilever geometry implementation 100 of a Piezovoltaic mechanism. This embodiment uses a laminate composition of thin film flexible solar charger 50, such as Triple-Junction flexible PV, that is PZV integrated onto a pre-stressed unimorph Thunder energy harvester laminate 52 that utilizes a PZT ceramic, a metal substrate, and a polyimide adhesive. Energy conversion mechanisms 50 and 52 are co-integrated through a boundary arrangement 14 as described in FIG. 1 or FIG. 2. Steel fixtures 51 ensure that the thunder mechanism is both in pre-stress state and enable mechanical integration with a specific platform application.

It will be obvious that a similar construction may incorporate a multilayer laminate vibration energy harvesting device such as of a multi-laminate composite construction or several layers of unimorph.

FIG. 8 provides a representation of cantilever geometry implementation of a Piezovoltaic mechanism. This embodiment provides for a photovoltaic wafer 11 comprising of individual solar junction cells (diodes) 13 to be PZV integrated onto a mechanical energy harvest cantilever 8 as described in FIG. 1 or FIG. 2. The entire PZV lamination is incorporated into an offset stiff structural attachment 41 that allows for the free bending moment motion of the PZV lamination, in particular the dielectric material 21 (see FIG. 1).

FIG. 9 provides a top-view representation of Piezovoltaic panel 9 that integrates an array of Piezovoltaic cantilever mechanisms 8 of FIG. 7 within an exterior housing 61 that are connected through the uniformly same connection points 62. The sectional segments of FIG. 8 of the invention obtained through manufacture process steps are not to scale, so that there is no proportional enlargement of the individual elements. The same elements of the individual cross-sectional segments, however, have the same reference numbers. This embodiment provides for a means to easily integrate an array of Piezovoltaic cantilever mechanisms 8 of FIG. 7 into an entire panel as a low profile multifunctional energy harvesting system that can be easily attached via its exterior housing 61.

FIG. 10 provides a side-view representation of Piezovoltaic panel 9 that integrates an array of Piezovoltaic cantilever mechanisms 8 of FIG. 8 within an exterior housing 61. Each Piezovoltaic cantilever element 8 (of FIG. 8) is rigidly integrated/supported by its individual offset fixture 41 through its pre-manufactured connector 62. Each individual Piezovoltaic cantilever element 8 is electrically terminated at its own harvester microcircuit 67 as described in FIG. 4 and FIG. 5. This would normally be installed in the panel 9 space made available due to the offset of each fixture 41. The resulting outputs of each of the individual microcircuits are stored in a thin profile battery pack 68 as dictated by the common controller circuit 69 (see FIG. 4).

We claim:

1. A piezovoltaic energy harvesting laminate comprising:
   a plurality of photovoltaic cells of a laminar wafer format;
   a dielectric material of a laminar wafer format capable of converting mechanical energy to electrical energy;
   a boundary laminate interface between the photovoltaic wafer and the dielectric material containing the metallization layer electrical terminal of the photovoltaic cells and containing a conduction layer of the dielectric material; and
   wherein said energy harvesting laminate outputs a voltage potential as a function of sunlight, and a voltage potential as a function of mechanical stress.

2. The piezovoltaic energy harvesting laminate of claim 1 wherein the metallization layer acting as an electrical terminal of the photovoltaic cells is non-conductively attached to a conduction layer of the dielectric material.

3. The piezovoltaic energy harvesting laminate of claim 1 wherein the metallization layer acting as an electrical terminal of the photovoltaic cells is non-conductively attached to a conduction layer of the dielectric material via an interposed isolation layer for stiffening the laminate.

4. A piezovoltaic module employing an array of cantilever laminate photovoltaic devices comprising:
   a housing;
   an array of piezovoltaic energy harvesting laminates of claim 1 mechanically installed as cantilever mechanisms;
   an individual energy harvesting circuit connected to the output terminals of one or more of said array of piezovoltaic energy harvesting laminates; and
   a common controller circuit connected to the outputs of the energy harvesting circuits and connected to an electrical load.

5. The piezovoltaic energy harvesting laminate of claim 1 wherein the photovoltaic wafer is flexible and said dielectric material is curvilinear and semi-rigid.

6. A flexible piezovoltaic laminate of claim 1 wherein consisting of a flexible photovoltaic laminate and flexible piezoelectric energy harvesting laminate.

7. The flexible piezovoltaic laminate of claim 1 wherein the photovoltaic wafer includes a flexible thin film photovoltaic laminate and a flexoelectric laminate.

8. The piezovoltaic energy harvesting laminate of claim 1 wherein said boundary laminate includes an adhesive conduction layer and an isolation layer disposed between the adhesive conduction layer and the conduction layer of the dielectric material.

9. The piezovoltaic energy harvesting laminate of claim 8 wherein the isolation layer is sufficiently stiff to shift a neutral axis of the dielectric material thereby increasing stress coupling of the dielectric material.

10. The piezovoltaic energy harvesting laminate of claim 8 wherein the isolation layer has a Young's Modulus of at least that of the dielectric layer.

11. The piezovoltaic energy harvesting laminate of claim 8 wherein the dielectric layer has a Young's Modulus of between 40 GPa and 400 GPa.

12. A piezovoltaic energy harvesting laminate comprising:

a photovoltaic wafer including a plurality of photovoltaic cells;

a dielectric material of a laminar wafer format capable of converting mechanical energy to electrical energy defining a energy conversion assembly; and a metallization layer disposed between said photovoltaic wafer and the energy conversion assembly including a common output terminal for said photovoltaic wafer and the energy conversion assembly.

13. A piezovoltaic energy harvesting device comprising: the piezovoltaic energy harvesting laminate of claim 1 connected to a stiff structural element and forming a cantilever structure.

* * * * *